United States Patent
Huang et al.

(10) Patent No.: US 8,955,810 B2
(45) Date of Patent: Feb. 17, 2015

(54) FASTENING MECHANISM AND DEVICE

(75) Inventors: Shi-Yong Huang, Shenzhen (CN);
Chung-Yuan Chen, New Taipei (TW);
Chih-Chieh Huang, New taipei (TW);
Cheng-Yi Chao, New Taipei (TW);
Zuo-Dong Li, Shenzhen (CN);
Xiao-Hui Qin, Shenzhen (CN);
Zhen-Cun Lu, Shenzhen (CN);
Jian-Feng Fan, Shenzhen (CN); Huan Ren, Shenzhen (CN); Zheng-Wei Liu, Shenzhen (CN); Xue-Deng Pan, Shenzhen (CN); Yong-Hua Wang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 152 days.

(21) Appl. No.: 13/487,267

(22) Filed: Jun. 4, 2012

(65) Prior Publication Data
US 2012/0325989 A1 Dec. 27, 2012

(30) Foreign Application Priority Data
Jun. 22, 2011 (CN) .......................... 2011 1 016 9443

(51) Int. Cl.
*A47G 29/00* (2006.01)
*A47K 1/00* (2006.01)
*A47K 3/00* (2006.01)
*E04G 5/06* (2006.01)

(52) U.S. Cl.
USPC ............ 248/220.21; 248/222.13; 248/222.52; 361/755; 361/759

(58) Field of Classification Search
CPC .................................. G06F 1/184; G06F 1/185
USPC ............. 248/220.21, 222.13, 222.52, 223.41, 248/224.8, 276.1, 274.1; 361/755, 759, 361/801, 679.01, 679.32, 752, 309.1
See application file for complete search history.

(56) References Cited

U.S. PATENT DOCUMENTS

| | | | | |
|---|---|---|---|---|
| 6,147,872 A * | 11/2000 | Roy | ............................... | 361/754 |
| 6,169,662 B1 * | 1/2001 | Clark et al. | .................... | 361/754 |
| 6,442,037 B1 * | 8/2002 | Boe | ................ | 361/759 |
| 7,364,447 B1 * | 4/2008 | Desrosiers et al. | ........... | 439/157 |
| 7,684,209 B2 * | 3/2010 | Roesner | ........................ | 361/798 |

* cited by examiner

Primary Examiner — Amy J Sterling
(74) Attorney, Agent, or Firm — Novak Druce Connolly Bove + Quigg LLP

(57) ABSTRACT

A fastening mechanism for fastening a first object to a second object, the fastening mechanism includes a first fastening member, a driven member, a linkage member, and a first supporting member. The first fastening member is rotatably secured to the second object. The driven member is rotatably secured to the second object. The linkage member is connected between the fastening member and the driven member. The first supporting member protrudes from the second object to support the first object. When an external force is exerted on the driven member, the driven member is capable of rotating to pull the linkage member, thus the linkage member pulls the first fastening member to rotate toward the first supporting member and sandwiches the first object between the first fastening member and the first supporting member so that the first object is fastened to the second object.

17 Claims, 5 Drawing Sheets

FASTENING MECHANISM AND DEVICE

BACKGROUND

1. Technical Field

The present disclosure relates to fastening mechanisms, and particularly to a device using a fastening mechanism.

2. Description of Related Art

Electronic devices use fasteners such as hooks to fasten electronic components in the housing of the electronic device. However, many hooks are easily damaged when the electronic components are removed or fastened repeatedly.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
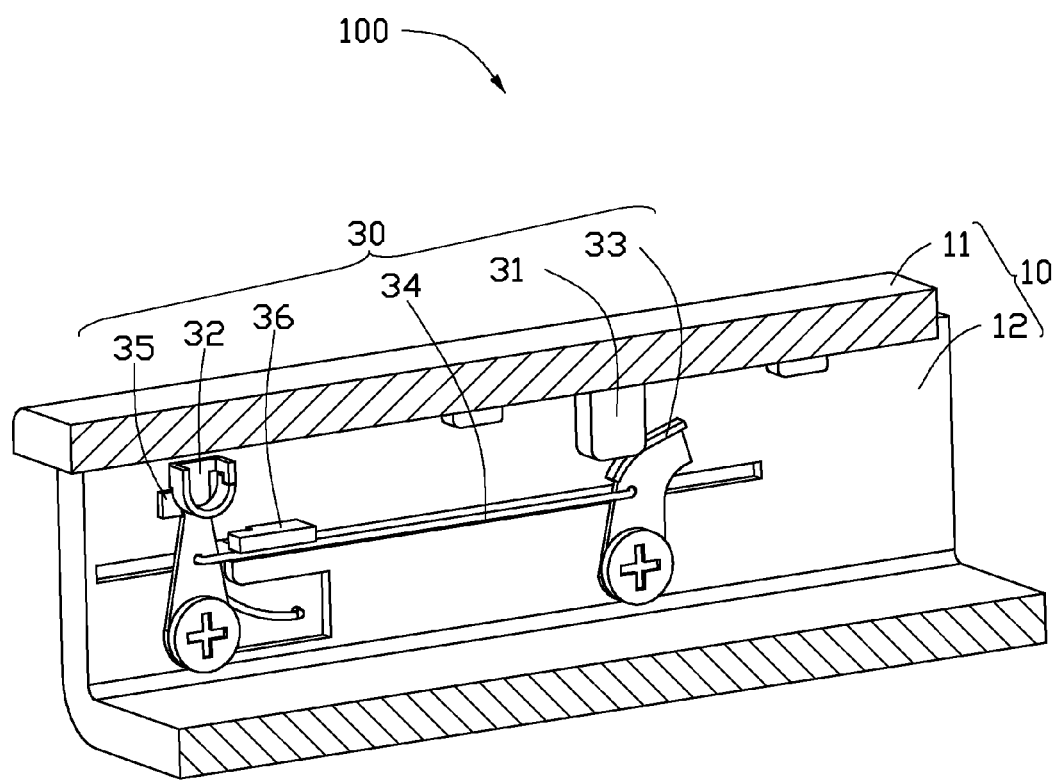
FIG. 1 is a cross-section view of an electronic device with a housing using a fastening mechanism in accordance with a first embodiment.
Figure 2:
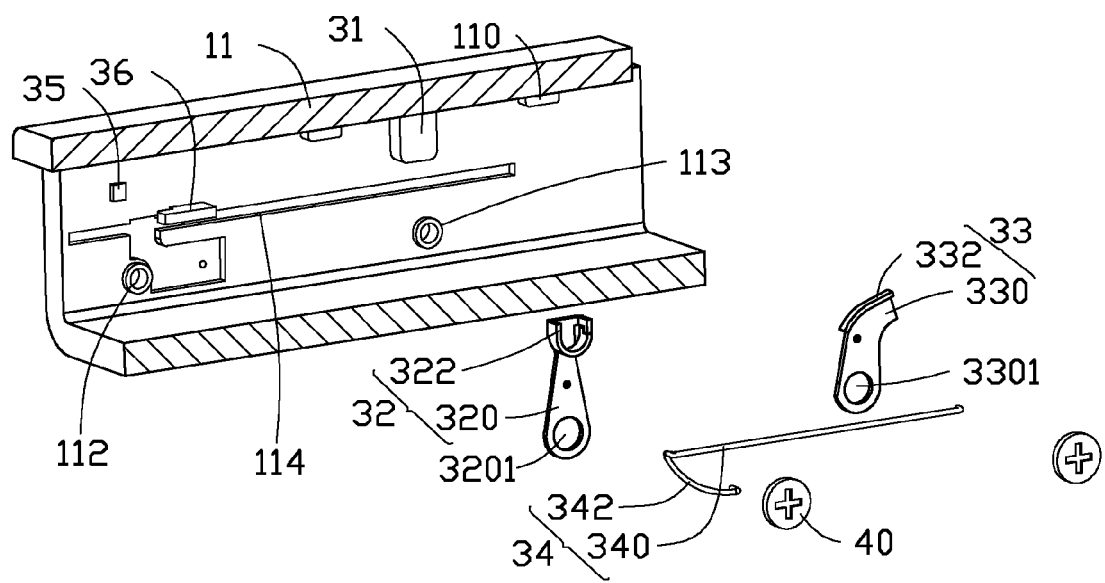
FIG. 2 shows an exploded view of the fastening mechanism in FIG. 1.

FIGS. 1 and 2 show an electronic device 100 in accordance with a first embodiment. The electronic device 100 includes a housing 10, and a fastening mechanism 30 received in the housing 10. The fastening mechanism 30 secures an object 200 in the housing 10 (see FIG. 4). For example, the electronic device 100 may be a mobile phone, a media player, and a notebook computer. The object 200 may be a circuit board, a loading board, or other components received in the housing 10.

The housing 10 includes a first shell 11 and a second shell 12. The first shell 11 is capable of moving with respect to the second shell 12, and then secured to the second shell 12. The first shell 11 includes a plurality of first clasping members 110. The second shell 12 includes a plurality of second clasping members (not shown) according to the plurality of first clasping members 110, a first sleeve column 112, a second sleeve column 113, and a receiving slot 114. The plurality of the first clasping members 110 clasp the plurality of the second clasping members, as a result, the first shell 11 and the second shell 12 are combined together. In another embodiment, the first shell 11 and the second shell 12 are combined together by screws or other means. The first sleeve column 112 and second sleeve column 113 are separated by an interval. The receiving slot 114 is defined along a straight line parallel to a line connected between the centers of the first sleeve column 112 and the second sleeve column 113.

The fastening mechanism 30 includes a driving member 31, a fastening member 32, a driven member 33, a linkage member 34, a blocking member 35, and a supporting member 36. The driving member 31 is positioned on the first shell 11.

The fastening member 32, the driven member 33, the linkage member 34, the blocking member 35, and the supporting member 36 are positioned on the second shell 12. The fastening member 32 and the driven member 33 are separated by an interval, and both can rotate with respect to the second shell 12. The linkage member 34 is connected between the fastening member 32 and the driven member 33. The blocking member 35 and the supporting member 36 are adjacent to the fastening member 32. The supporting member 36 is positioned between the fastening member 32 and the driven member 33. The blocking member 35 is away from the supporting member 36.

The fastening member 32 is made of a thin metal board. The fastening member 32 includes a first rotating arm 320, and a resisting member 322. The first rotating arm 320 includes opposite ends. The width of the first rotating arm 320 gradually decreases from the one end to the other end. The wide end of the first rotating arm 320 defines a first pivot hole 3201 holding the first sleeve column 112. A screw 40 is screwed in the first sleeve column 112, as a result the wide end of the first rotating arm 320 is secured to the second shell 12, and can rotate around the first sleeve column 112. The narrow end of the first rotating arm 320 is restricted between the blocking member 35 and the supporting member 36. As a result, the ends of the first rotating arm 320 are positioned on opposite sides of the receiving slot 114. The resisting member 322 is cambered, opposite ends of the resisting member 322 are connected to the narrow end of the first rotating arm 320. One end of the resisting member 322 adjacent to the supporting member 36 defines a gap (not labeled) to separate the one end of the resisting member 322 from the narrow end of the first rotating arm 320. As a result, the resisting member 322 can deform and not easily rupture when a force is pressed on it.

The driven member 33 includes a second rotating arm 330, and a driven part 332. One end of the second rotating arm 330 defines a second pivot hole 3301 holding the second sleeve column 113. Another screw 40 is screwed in the second sleeve column 113, as a result, the end of the second rotating arm 330 is secured to the second shell 12 and can rotate around the second sleeve column 113. The other end of the second rotating arm 330 is curved to deviate away from the fastening member 32. The driven part 332 is a flange protruding from the edge of the other end of the second rotating arm 330.

The linkage member 34 is made of metal material. The linkage member 34 includes a beeline portion 340, and a curved portion 342 connected to the beeline portion 340. The end of the beeline portion 340 away from the curved portion 342 fastens the second rotating arm 330. The curved portion 342 is inserted through the first rotating arm 320, and the end of the curved portion 342 hooks the second shell 12. As a result, the beeline portion 340 is arranged along the receiving slot 114, the fastening member 32 and the driven member 33 are joined. The driven part 332 is pulled toward the first shell 11, and is positioned on one side of the slot 114 opposite to one end of the second rotating arm 330 is secured to the second shell 12.

The blocking member 35 protrudes from the second shell 12, and is located in a motion track of the fastening member 32. The blocking member 35 is adjacent to the first shell 11. In another embodiment, the blocking member 35 is not needed when the resisting member 322 is capable of being pulled to the exact position by the linkage member 34.

The supporting member 36 protrudes from the second shell 12, and is located in the motion track of the fastening member 32. The supporting member 36 is adjacent to the receiving slot 114, and is between the blocking member 35 and the receiving slot 114, and under the resisting member 322. The supporting member 36 loads the object 200. The object 200 defines an opening (not labeled) to enable the rotation of the fastening member 32.

The driving member 31 protrudes from the first shell 11 toward the second shell 12. The driving member 31 moves when the first shell 11 is moved. The motion track of the driving member 31 passes the driven member 33.

Figure 3:
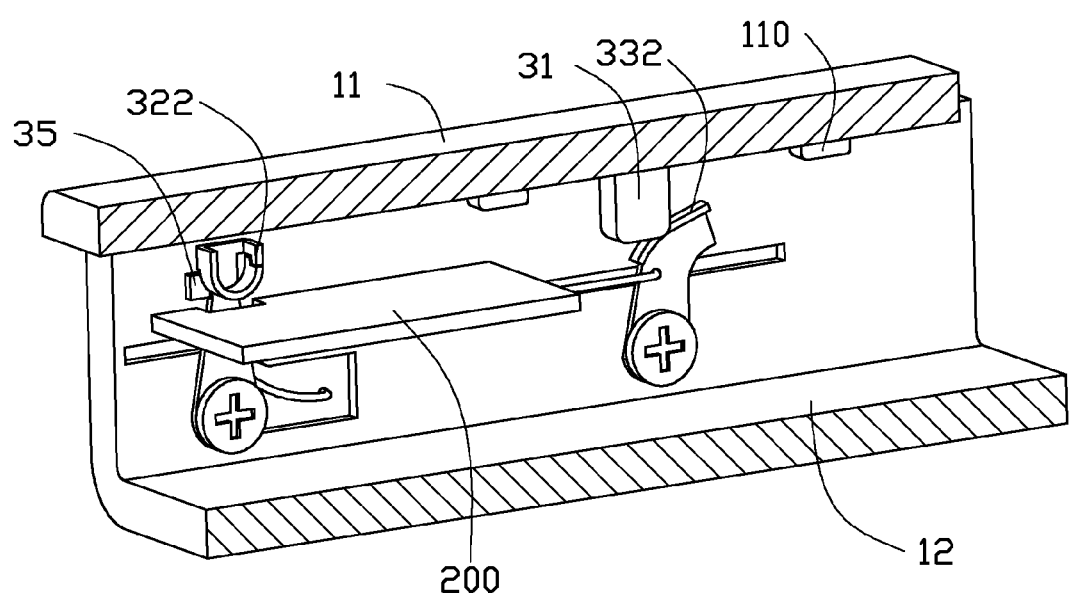
FIG. 3 shows a first state of the fastening mechanism in FIG. 1.
Figure 4:
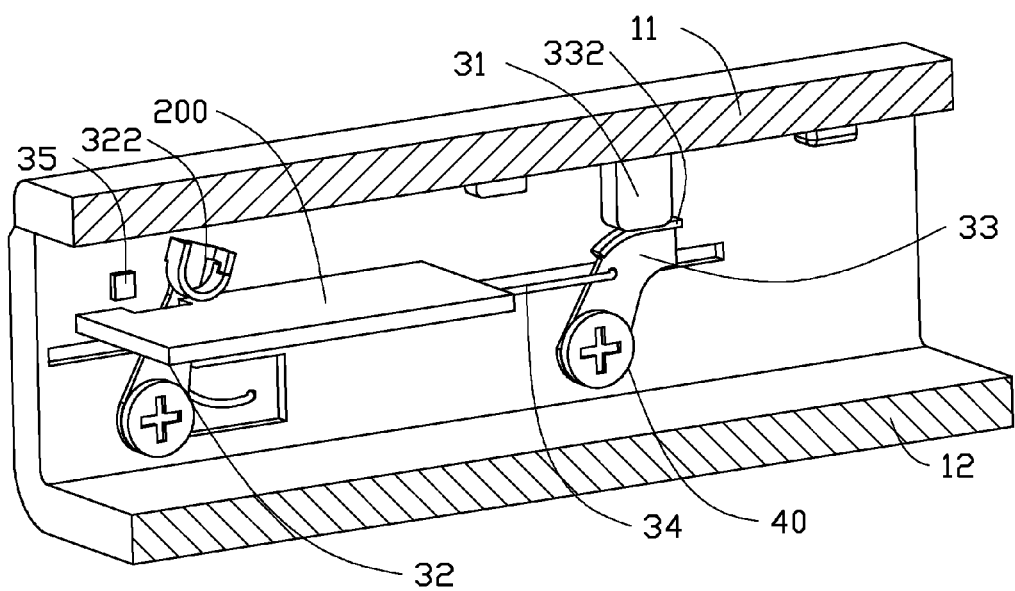
FIG. 4 shows a second state of the fastening mechanism in FIG. 1.

FIGS. 3 and 4, show in operation, first, the object 200 is placed on the supporting member 36. Second, the first shell 11 is pushed to move with respect to the second shell 12 in a direction from the fastening member 32 to the driven member 33, and the driving member 31 moves to the driven member 33 and drives the driven member 33 to rotate away from the supporting member 36. At the same time, the fastening member 32 rotates, and the resisting member 322 moves toward the object 200 supported by the supporting member 36, until the plurality of the first clasping members 110 are clasped by the plurality of the second clasping members. The first shell 11 and the second shell 12 are joined, at the same time, the resisting member 322 presses on the object 200. As a result, the object 200 is clamped between the resisting member 322 and the supporting member 36.

Figure 5:
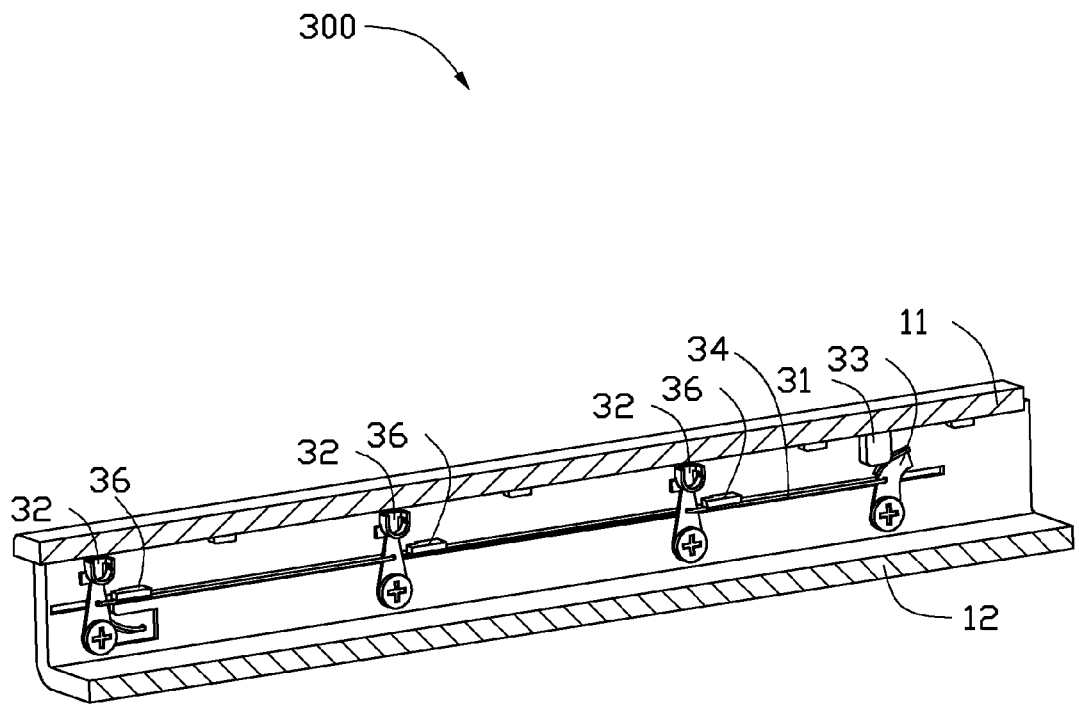
FIG. 5 is a cross-section view of an electronic device in accordance with a second embodiment.

FIG. 5 shows an electronic device 300 in accordance with the second embodiment. The electronic device 300 includes three fastening members 32 and three supporting members 36 corresponding to the three fastening members 32. The three fastening members 32 are connected in sequence by the linkage member 34. The other components of the electronic device 300 are the same as the electronic device 100. In comparison with the electronic device 100, the electronic device 300 is more adaptive to fasten large objects, or is capable of fastening more objects at the same time.

Even though relevant information and the advantages of the present embodiments have been set forth in the foregoing description, together with details of the functions of the present embodiments, the disclosure is illustrative only; and changes may be made in detail, especially in the matters of shape, size, and arrangement of parts within the principles of the present embodiments to the full extent indicated by the broad general meaning of the terms in which the appended claims are expressed.

What is claimed is:

1. A fastening mechanism for fastening a first object to a second object, the fastening mechanism comprising:
   a first fastening member rotatably secured to the second object;
   a driven member rotatably secured to the second object;
   a linkage member connected between the fastening member and the driven member; and
   a first supporting member protruding from the second object to support the first object;
   wherein when an external force is exerted on the driven member, the driven member is capable of rotating to pull the linkage member, and the linkage member pulls the first fastening member to rotate toward the first supporting member, the first object is clamped by the first fastening member and the first supporting member so that the first object is fastened to the second object, both of the linkage member and the first object are moved along a same direction.

2. The fastening mechanism of claim 1, wherein the first supporting member is positioned between the first fastening member and the driven member, the driven member is driven to rotate away from the first supporting member to enable the first fastening member to rotate toward the first supporting member.

3. The fastening mechanism of claim 1, wherein the first fastening member comprises a first rotating arm, and a resisting member, one end of the first rotating arm is rotatably secured to the second object, the other end of the first rotating arm is connected to the resisting member, the resisting member is capable of pressing on the first object.

4. The fastening mechanism of claim 3, wherein the resisting member is camber shaped, one end of the resisting member is connected to the first rotating arm, the other end of the resisting member is free.

5. The fastening mechanism of claim 1, wherein the driven member comprises a second rotating arm, and a driven part, one end of the second rotating arm is rotatably secured to the second object, the other end of the second rotating arm is curved to deviate away from the first supporting member, the driven part protrudes from the edge of the other end of the second rotating arm.

6. The fastening mechanism of claim 1, wherein the linkage member comprises a beeline portion and a curved portion connected to one end of the beeline portion, the other end of the beeline portion is fastened the driven member, the curved portion is inserted through the first fastening member, and the end of the curved portion is fastened the second object.

7. The fastening mechanism of claim 1, further comprising a blocking member, wherein the first fastening member is restricted between the blocking member and the first supporting member.

8. The fastening mechanism of claim 1, further comprising a plurality of second fastening members and a plurality of second supporting members, wherein the second fastening members are rotatably secured to the second object and positioned between the first supporting member and the driven member, the second fastening members are connected in sequence between the first fastening member and the driven member by the linkage member; the plurality of second supporting members are adjacent to the second fastening members respectively.

9. A device for fastening an object thereon, the device comprising:
   a housing having a first shell and a second shell, the first shell being capable of moving with respect to the second shell; and
   a fastening mechanism comprising:
   a driving member fixed on the first shell;
   a first fastening member rotatably secured to the second shell;
   a driven member rotatably secured to the second shell;
   a linkage member connected between the fastening member and the driven member; and
   a first supporting member protruding from the second shell to support the object;
   wherein when the first shell moves with respect to the second shell to be secured to the second shell, the driving member moves to enable the driven member to rotate, the linkage member is pulled by the driven member to pull the first fastening member to rotate toward the first supporting member to enable the object to be sandwiched between the first fastening member and the first supporting member so that the object is fastened.

10. The device of claim 9, wherein the supporting member is positioned between the first fastening member and the driven member, when the driven member rotates away from the first supporting member, the first fastening member rotates toward the first supporting member.

11. The device of claim 9, wherein the first fastening member comprises a first rotating arm and a resisting member, one end of the first rotating arm is rotatably secured to the second shell, the other end of the first rotating arm is connected to the resisting member, the resisting member is capable of pressing on the object.

12. The device of claim 11, wherein the resisting member is camber shaped, one end of the resisting member is connected to the first rotating arm, the other end of the resisting member is free.

13. The device of claim 9, wherein the driven member comprises a second rotating arm and a driven part, one end of the second rotating arm is rotatably secured to the second shell, the other end of the second rotating arm is curved to deviate away from the first supporting member, the driven part protrudes from the edge of the other end of the second rotating arm.

14. The device of claim 9, wherein the linkage member comprises a beeline portion and a curved portion connected to one end of the beeline portion, the other end of the beeline portion is fastened the driven member, the curved portion is inserted through the first fastening member, and the end of the curved portion is fastened the second shell.

15. The device of claim 14, wherein the second shell further defines a receiving slot, the beeline portion is positioned along the receiving slot.

16. The device of claim 9, wherein the fastening mechanism further comprises a blocking member, the first fastening member is restricted between the blocking member and the first supporting member.

17. The device of claim 9, further comprising a plurality of second fastening members and a plurality of second supporting members, the second fastening members are rotatably secured to the second shell and positioned between the first supporting member and the driven member, the second fastening members are connected in sequence between the first fastening member and the driven member by the linkage member; the plurality of second supporting members are adjacent to the second fastening members respectively.

* * * * *